United States Patent [19]

Kohno et al.

[11] Patent Number: 4,985,098
[45] Date of Patent: Jan. 15, 1991

[54] METHOD OF MANUFACTURING CERAMIC LAMINATE

[75] Inventors: Yoshiaki Kohno; Norio Sakai, both of Kyoto, Japan

[73] Assignee: Murata Manufacturing Co., Ltd., Japan

[21] Appl. No.: 312,024

[22] Filed: Feb. 16, 1989

[30] Foreign Application Priority Data

Feb. 19, 1988 [JP] Japan .................................. 63-37949

[51] Int. Cl.$^5$ ...................... B32B 31/20; C04B 41/88; H01G 4/14
[52] U.S. Cl. ..................................... 156/89; 156/310; 156/155; 29/25.42; 427/79
[58] Field of Search ................. 156/89, 310, 280, 155; 29/25.42; 427/79

[56] References Cited

U.S. PATENT DOCUMENTS

| | | | |
|---|---|---|---|
| 4,269,641 | 5/1981 | Ebata et al. | 156/89 |
| 4,299,638 | 11/1981 | Matsuhisa | 156/89 |
| 4,510,175 | 4/1985 | Burn | 427/79 |
| 4,735,666 | 4/1988 | Mase et al. | 156/89 |
| 4,766,671 | 8/1988 | Utsumi et al. | 156/89 |
| 4,799,983 | 1/1989 | Desai | 156/89 |
| 4,799,984 | 1/1989 | Rellick | 156/89 |

FOREIGN PATENT DOCUMENTS

0080310 6/1980 Japan ...................................... 156/89

Primary Examiner—David L. Lacey
Assistant Examiner—Todd J. Burns
Attorney, Agent, or Firm—Ostrolenk, Faber, Gerb & Soffen

[57] ABSTRACT

Disclosed is a method of manufacturing a ceramic laminate which is adapted to manufacture a laminated ceramic capacitor, for example. This method includes the steps of stacking a plurality of ceramic green sheets containing ceramic powder and a first binder on a base and forming a metal paste film containing metal powder and a second binder for providing an internal electrode on an upper major surface of a prescribed one of the ceramic green sheets during the stacking step. In such a method, a junction member containing a solvent which can commonly dissolve the first and second binders is prepared in order to join the plurality of ceramic green sheets with no application of pressure, to be applied between adjacent pairs of plurality of ceramic green sheets, which are stacked with each other. The junction member joins the adjacent pairs of ceramic green sheets with each other through chemical action.

35 Claims, 5 Drawing Sheets

PRIOR ART

FIG. 14

PRIOR ART

FIG. 15

METHOD OF MANUFACTURING CERAMIC LAMINATE

BACKGROUND OF THE INVENTION

1. Field of the Invention

The present invention relates to a method of manufacturing a ceramic laminate which is adapted to provide a laminated ceramic capacitor, a laminated LC composite part, a ceramic multilayer substrate or the like, and more specifically, it relates to a method of manufacturing a laminate by stacking ceramic green sheets.

2. Description of the Background Art

A component such as a laminated ceramic capacitor or a ceramic multilayer substrate, for example, has a laminated structure comprising ceramic sheets provided with an internal electrode which is interposed at least one interface, between at least two of the sheets. Such components have been generally obtained by applying ceramic slurry on one surface of a carrier film through a doctor blade method or the like and drying the same, separating a resulting ceramic green sheet from the carrier film, printing metal paste on the ceramic green sheet by screen printing or the like and drying the same, stacking a desired number of such ceramic green sheets to obtain a laminate, and pressurizing the laminate along the direction of stacking under appropriate conditions. This laminate is then cut if necessary, and thereafter fired to obtain a sintered ceramic laminate.

Figure 11:
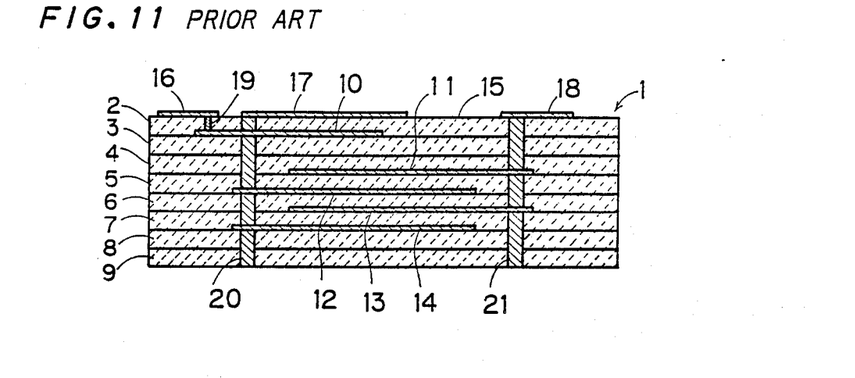
FIG. 11 is a sectional view illustrating a conventional ceramic multilayer substrate 1, which is a component employing a ceramic laminate illustrating problems that are solved by the present invention.

FIG. 11 is a sectional view showing a ceramic multilayer substrate 1 which is obtained basically through the aforementioned steps. Referring to FIG. 11, the substrate 1 comprises a plurality of ceramic layers 2 to 9 and internal electrodes 10 to 14 which are provided in interfaces between specific ones of the ceramic layers 2 to 9. A plurality of conductor films 16 to 18 are formed on one major surface 15 of the substrate 1. The conductor film 16 is electrically connected with the internal electrode 10 through a conductive internal through hole 19 passing through the ceramic layer 2. Further, two through hole connecting portions 20 and 21, for example, are defined to pass through the substrate 1, so that the through hole connecting portion 20 electrically connects the conductor film 17 and the internal electrodes 10, 12 and 14 with each other while the other through hole connecting portion 21 electrically connects the conductor film 18 and the internal electrodes 11 and 13 with each other.

When the ceramic multilayer substrate 1 shown in FIG. 11 is obtained by the aforementioned method, however, the following problems are caused:

A laminate of ceramic green sheets prepared to obtain the laminated structure of the ceramic layers 2 to 9 is pressurized in a stage before firing, as hereinabove described. Relatively high pressure is applied for such pressurization, and this can easily cause distortion of the green ceramic laminate, including the metal paste films which provide the internal electrodes 10 to 14. In general, such distortion is so non-uniform that it is difficult to obtain a green ceramic laminate, including the metal paste films, having the designed dimensions. Thus, such a green ceramic laminate frequently deviates from the designed dimensions, which reduces the yield of the manufacturing process. Non-uniform distortion of the green ceramic laminate in the aforementioned pressurizing step causes a significant problem particularly in the ceramic multilayer substrate 1 shown in FIG. 11, for example, which requires high position accuracy for the internal electrodes 10 to 14, the conductive internal through hole 19 and the like.

Further, the dried ceramic green sheets which provide the ceramic layers 2 to 9 are basically different in their material composition from the dried metal paste films which provide the internal electrodes 10 to 14. Sufficient junction strength cannot be attained by compressing such members made of basically different materials under mechanical pressure, and hence the finished product obtained upon firing has reduced rupture strength and reduce resistance against thermal shock. Even delamination may result in an extreme case.

Figure 12:
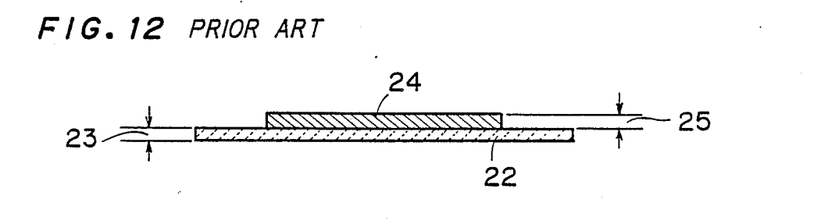
FIGS. 12 and 13 are diagrams for explaining further problems of the first prior art example shown in FIG. 11.
Figure 13:
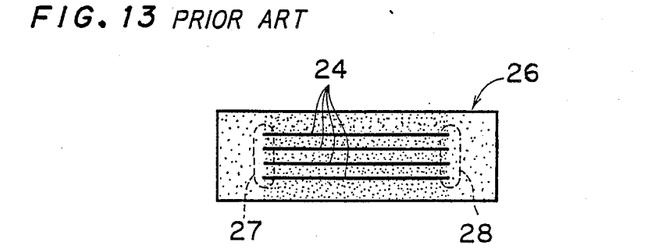

For example in order to obtain a large capacitance in a laminated ceramic capacitor, a ceramic layer located between each pair of internal electrodes is most typically reduced in thickness. Referring to FIG. 12, a ceramic green sheet 22 is so thinned that its physical thickness 23 is substantially equal to the physical thickness 25 of a metal paste film 24 upon drying. When such ceramic green sheets 22 are stacked with each other, the thickness 25 of the metal paste film 24 partially formed on one major surface of each ceramic green sheet 22 cannot be neglected. As shown in FIG. 13, relatively large stresses remain in portions 27 and 28 corresponding to the edges of the metal paste films 24 upon pressurization of a laminate 26 of the ceramic green sheets 22. Such stress causes delamination or insufficient resistance against thermal shock after firing. This problem restricts the amount the thickness of the ceramic layers can be reduced for obtaining a large capacitance.

Another problem that arises in manufacturing a laminated ceramic capacitor, occurs when metal paste films for providing internal electrodes are printed on ceramic green sheets and dried, and then the ceramic green sheets are stacked with each other in an aligned state. However, when such ceramic green sheets are reduced in thickness as hereinabove described, the mechanical strength thereof is also reduced. Thus, it has been extremely difficult to register the ceramic green sheets as required for the steps of printing the metal paste films, stacking the ceramic green sheets and the like. Even if carrier films are employed for holding thin ceramic green sheets in such registration in order to compensate for the lack of mechanical strength, complicated and high-priced equipment is required for a registration mechanism, in order to handle basically thin substances.

Figure 14:
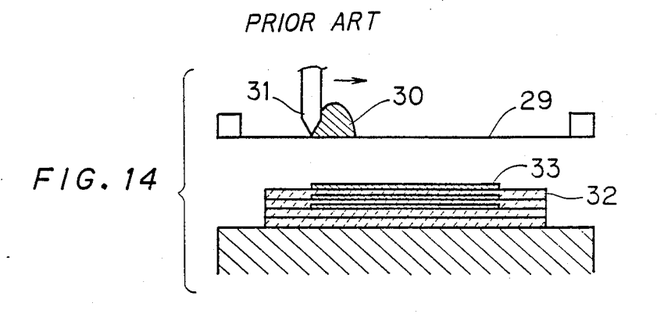
FIGS. 14 and 15 are diagrams for explaining a second prior art example having problems solved by the present invention.
Figure 15:
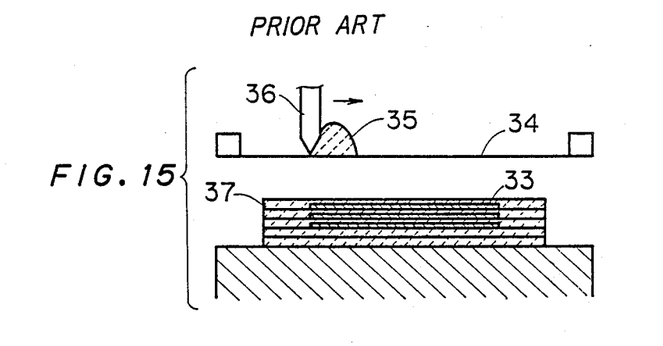

FIGS. 14 and 15 show the so-called print lamination method, which is adapted to solve the aforementioned problem. This method basically repeats the steps shown in FIGS. 14 and 15. Referring to FIG. 14, for example, a squeegee 31 is driven in the direction of the arrow to act on a quantity of metal paste 30 which is placed on a screen 29, thereby to form a metal paste film 33 for providing an internal electrode. Then, as shown in FIG. 15, another squeegee 36 is driven in the direction of the arrow to act on a quantity of ceramic slurry 35 which is placed on a screen 34, thereby to form a green ceramic layer 37 for covering the metal paste film 33. Respective ones of such quantities of ceramic slurry 35 and metal paste 30 are repeatedly printed and dried to obtain a desired laminate.

However, the aforementioned print lamination method has the following problems:

First, a green ceramic layer formed by printing has a higher number of defects than a sheet formed through casting by the doctor blade method or the like. Thus, it is necessary to reduce the number of defects by repeating the printing step a plurality of times particularly for forming a green ceramic layer to be held between internal electrodes. This leads to reduction in productivity.

Further, the only means available for adjusting the thickness of a ceramic layer located between internal electrodes is merely controlling the printing conditions. Such control is relatively difficult in practice. In addition, the thickness of the ceramic layer cannot be easily managed if printing must be repeated a plurality of times in order to obtain one ceramic layer as hereinabove described. Thus, the resulting capacitance often deviates from a designed value, to cause reduction in yield.

Another problem is that in order to attain sufficient mechanical required for a laminated ceramic capacitor, upper and lower portions of a laminate must be covered with ceramic outer layers having no internal electrodes. However, the maximum thickness of a ceramic layer which can be formed by screen printing is several to tens of micrometers at the most. Thus, if hundreds of micrometers are required for each of the upper and lower outer layers, the number of printing times is extremely increased to cause reduction in productivity.

In both of the aforementioned methods of forming ceramic green sheets, namely through casting by the doctor blade method or the like, and by the print lamination method, pores and pinholes may be defined in the ceramic layers when their thickness is reduced. Thus, a capacitor may be reduced in voltage resistance, for example, or a short may be caused across the internal electrodes, in an extreme case.

SUMMARY OF THE INVENTION

Accordingly, an object of the present invention is to provide a method of manufacturing a ceramic laminate, and more specifically, to provide a method of manufacturing a laminate by stacking ceramic green sheets, which can advantageously solve the aforementioned problems of the prior art.

The present invention is generally directed to a method of manufacturing a ceramic laminate, which is formed by stacking a plurality of ceramic green sheets containing ceramic powder and a first binder, with at least one metal paste film, containing metal powder and a second binder, provided in the interface between at least an adjacent pair of the plurality of ceramic green sheets. In order to solve the aforementioned technical problems, the manufacturing method according to the present invention comprises the following steps:

preparing a junction member containing a solvent which can commonly dissolve the first binder and the second binder;
preparing a base for receiving the plurality of ceramic green sheets thereon; and
stacking the ceramic green sheets on the junction member on the base. The metal paste film is formed on a prescribed one of the ceramic green sheets stacked on the base.

In the present invention, the plurality of ceramic green sheets containing the ceramic powder and the first binder are not all necessarily made of the same materials with respect to the ceramic powder and the binder, but may be prepared from different materials.

According to the present invention, a plurality of ceramic green sheets are stacked to obtain a laminate through chemical bonding by means of a junction member applied between adjacent pairs of the ceramic green sheets, without the application of high pressure. Thus, the laminate is protected against non-uniform distortion, thereby to prevent reduction in yield caused by deviation in capacitance, etc.

The junction member contains a solvent which can dissolve both the first binder contained in the ceramic green sheets and the second binder contained in the metal paste films, thereby to increase the junction strength between the ceramic green sheets themselves and between the ceramic green sheets and the metal paste films. Thus, the rupture strength after firing is improved, while the resistance against thermal shock is also enhanced. Further, defects such as delamination are reduced.

The junction member employed in the present invention can also contain ceramic slurry, in order to fill up pores and pinholes upon application to the ceramic green sheets. Thus, ceramic layers located between internal electrodes, for example, which are obtained by applying metal paste films, can be reduced in thickness with no reduction in voltage resistance and no shorts across the internal electrodes, thereby to obtain a small-sized capacitor having large capacitance.

Further, also advantageously solved is the problem of reducing the thickness of a ceramic green sheet in a laminated ceramic capacitor, for example, to be substantially identical to that of a metal paste film providing an internal electrode, such that the thickness of the metal paste film formed on part of the ceramic green sheet and providing an internal electrode cannot be neglected. As mentioned above, this problem results in residual stress, causing delamination and reduction in resistance against thermal shock, around the edges of the metal paste film, when the laminate is pressurized. This problem is solved because there is no need to positively pressurize the laminate under high pressure according to the present invention. The junction member can advantageously absorb any difference in thickness between a part of the ceramic green sheet provided with the metal paste film and the remaining par, as necessary.

Although a large amount of binder is generally required in the prior art to adhere metal paste films to ceramic green sheets in a step of pressurizing an unfired laminate, the amount of such a binder can be reduced according to the present invention, thereby to reduce the thickness of the metal paste films in response. This feature of the present invention is also effective to solve the aforementioned problem concerning difference in thickness between parts of the ceramic green sheets caused by formation of the metal paste films.

Further, although a large amount of plasticizer must be generally contained in ceramic green sheets which are subjected to a pressurizing step as in the prior art, the amount of such a plasticizer can be reduced according to the present invention, whereby the ceramic green sheets can be increased in thickness and reduced in contraction upon drying, to improve the quality of a finished product.

According to the present invention, no pressurizing step is required dissimilaryly to the prior art, whereby the cost required for such a pressurizing step can be saved to greatly reduce the manufacturing cost.

According to the present invention, further, the metal paste film is formed on the ceramic green sheet by printing after the ceramic green sheet has been positioned by means of the base, whereby no misregistration of the metal paste film is caused by a registration error in stacking of the ceramic green sheets and whereby high accuracy is not required for alignment of the stacked ceramic green sheets. Thus, a positioning mechanism employed for stacking the ceramic green sheets may be simplified in structure, to require no high-priced equipment.

These and other objects, features, aspects and advantages of the present invention will become more apparent from the following detailed description of the present invention when taken in conjunction with the accompanying drawings.

DESCRIPTION OF THE PREFERRED EMBODIMENTS

The present invention is now described in more detail with reference to embodiments of a method of manufacturing a laminated ceramic capacitor.

Figure 1:
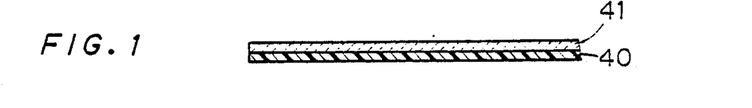
FIGS. 1 to 7 are enlarged sectional views sequentially showing typical steps included in an embodiment of a method of manufacturing a laminated ceramic capacitor according to the present invention.

As shown in FIG. 1, ceramic slurry is applied to one surface of a carrier film 40 by the doctor blade method or the like to form a ceramic green sheet 41, which is thereafter dried.

Figure 2:
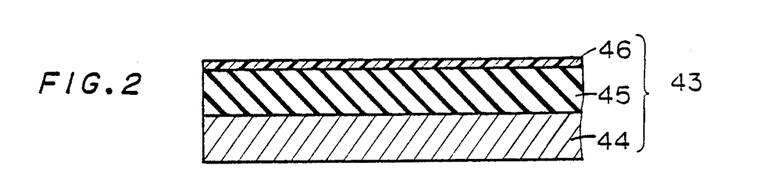

As shown in FIG. 2, a base 43 is prepared to be employed for supporting other layers while carrying out a stacking step. The base 43 comprises a rigid plate 44, which is adapted to facilitate location of substances to be stacked in the later stacking step. In order to permit repeated heating operations for carrying out drying and cooling in the stacking step, the rigid plate 44 is preferably formed of a material having a small thermal expansion coefficient, such as super invar alloy made from nickel steel, whose thermal expansion coefficient is about 1/100 of that of stainless steel. Alternatively, the rigid plate 44 may be formed of glass, ceramic or the like. An elastic layer 45 of silicone rubber, for example, is formed on the rigid plate 44, in order to absorb any irregularity of the rigid plate 44 in the stacking step. This elastic layer 45 has thickness of about 1 to 5 mm, and hardness of about 40 to 80. A resin film 46 of polyethylene terephthalate, for example, is formed on the elastic layer 45.

The stacking step is carried out after preparation of the base 43. In this embodiment, the ceramic green sheet 41 contains barium titanate ceramic powder containing about 13 percent by weight of an acrylic binder, and is formed into a sheet by employing ceramic slurry which is prepared by dissolving such a material in a delay solvent such as BCA (butyl carbitol acetate). It has been confirmed that the following stacking step can also be similarly carried out by employing another ceramic material such as an alumina ceramic material or by employing another binder such as a cellulose or vinyl binder.

Figure 3:
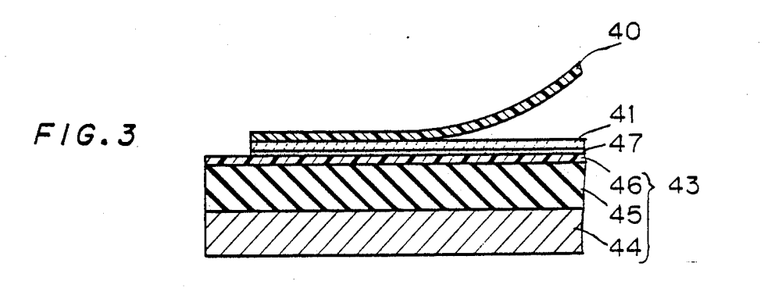

After the base is prepared, a junction member 47 is applied on the base 43 by screen printing, pad printing, the doctor blade method or the like, as shown in FIG. 3. This junction member 47 is prepared in this example from slurry having the same ceramic raw material and the same binder as the ceramic green sheet 41. It also contains a solvent as mentioned above. Then, the ceramic green sheet 41 prepared as shown in FIG. 1 is stacked on the junction member 47, to contain no air. Then the carrier film 40 is separated from the ceramic green sheet 41. The carrier film 40 may also be separated before stacking of the ceramic green sheet 41.

Thereafter the junction member 47, the base 43 and the ceramic green sheet 41 are dried at a temperature of 150° C. for about two minutes, for example. The dried substance is then cooled.

Figure 4:
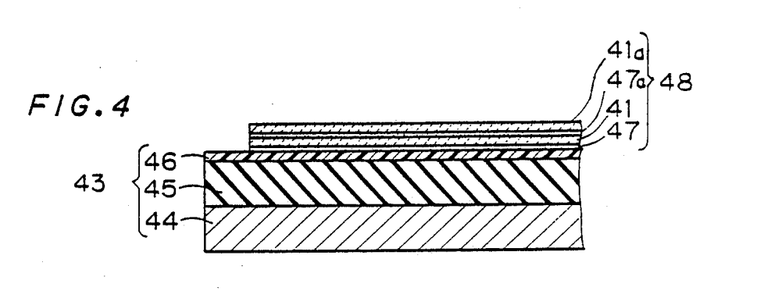

The aforementioned step is repeated a desired number of times, to obtain a lower outer layer block 48 comprising an additional junction member 47a and ceramic green sheet 41a, but not yet sheets 41 provided with metal paste films, as shown in FIG. 4.

Then, the base 43 holding the outer layer block 48 shown in FIG. 4 is positioned in a screen printer.

Figure 5:
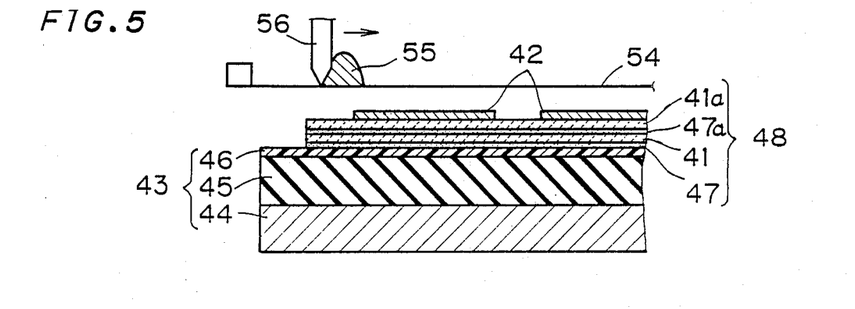

After positioning, metal paste films 42 are formed in prescribed patterns on an upwardly directed major surface of the uppermost ceramic green sheet 41a, as shown in FIG. 5. The metal paste films 42 are formed by driving a squeegee 56 against a quantity of metal paste 55, which is placed on a screen 54, in the direction of the arrow. The method of printing the metal paste films 42 is not restricted to screen printing, but another method, such as pad printing, for example, may be employed. The metal paste films 42 thus printed are dried and then cooled.

A drying step is carried out for the metal paste films 42 which is similar to that for the ceramic green sheet 41 and the junction member 47, as hereinabove described. Thus, the junction member 47 may be dried simultaneously with the metal paste films 42 in the same step. In relation to this, the metal paste films 42 are preferably successively dried upon formation in advance of subsequent processing so that the patterns thereof are not damaged. On the other hand, the junction member 47 can be dried at any absolutely arbitrary stage.

Figure 6:
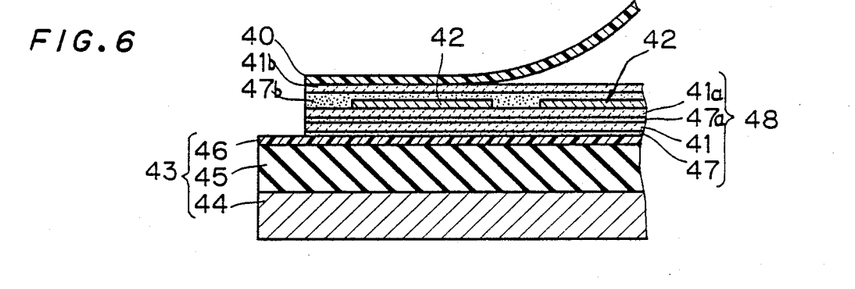

Then, as shown in FIG. 6, another junction member 47b is applied over the entire surface of the outer layer block 48, which is provided with the metal paste films 42 shown in FIG. 5. This junction member 47b is similar in application method and composition to the junction members 47a described with reference to FIG. 3.

Then, another ceramic green sheet 41b having a carrier film 40 as shown in FIG. 1 is stacked on the junction member 47b, to contain no air. Thereafter the carrier film 40 is separated. Alternatively, the ceramic green sheet 41b shown in FIG. 6 may be stacked after separating the carrier film 40.

The step of forming the metal paste films 42 shown in FIG. 5 and that of applying the junction member 47b and stacking the ceramic green sheet 41b shown in FIG. 6 are repeated a desired number of times. No high accuracy is required for stacking the ceramic green sheet 41b and additional ceramic green sheets on those printed with the metal paste films 42. In other words, the ceramic green sheets merely should be stacked in position accurately enough that subsequently printed metal paste films 42 do not spread beyond the margins of precedingly provided ceramic green sheets. Further, while the junction members may be dried at any arbitrary state as hereinabove described, it is efficient and preferable to dry each junction member simultaneously with any metal paste films 42 which are formed on a ceramic green sheet which has been stacked on the said junction member.

Figure 7:
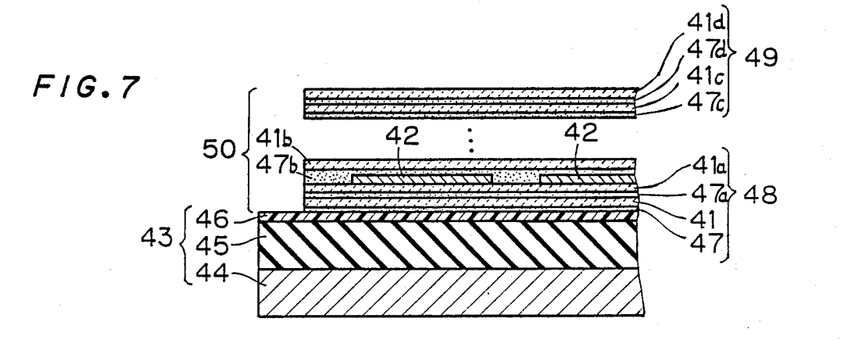

Then, steps similar to those described with reference to FIGS. 3 and 4 are carried out in order to form an upper outer layer block 49 as shown in FIG. 7 including additional ceramic green sheets 41c and 41d stacked on the ceramic green sheet 41b, alternating with additional junction members 47c and 47d.

Thus, a green ceramic laminate 50 is obtained, to be subjected to a final drying step at a temperature of 100° to 120° C. for about 24 to 48 hours, for example. The final drying step is adapted to dry solvents contained in the green ceramic laminate 50 as completely as possible.

Junction member included in the upper outer layer block 49 shown in FIG. 7 may be simultaneously dried in the aforementioned final drying step, in place of successive drying.

Thereafter the laminate 50 is cut to provide a chip having prescribed dimensions, calcined and subjected to firing and then provided with external electrodes, thereby to provide a desired laminated ceramic capacitor.

The aforementioned final drying step may be carried out at the same time as the calcination step, after cutting into the chip form.

In the aforementioned embodiment, the thickness of each ceramic green sheet such as 41 in a green state may be about 5 to 30 μm in practice.

The junction member such as 47 may be prepared from slurry which has the same ceramic raw material as the ceramic green sheet 41 but has a different binder. When an aqueous binder is employed for the ceramic green sheet 41, for example, the junction member 47 may be prepared from slurry containing an organic binder.

In the above manufacturing method for obtaining a laminated ceramic capacitor, the ceramic green sheets 41 contained in the laminate 50 are adapted to provide the dielectric members of the capacitor, for example. On the other hand, ceramic green sheets employed to make a laminated LC composite component, for example, do not have the same ceramic material as each other but are prepared from different materials to provide both dielectric sheets and magnetic sheets. Also in this case, as in the products described above, a junction member may be prepared from a material containing a solvent which can commonly dissolve binders contained in the respective ones of such sheets of different materials.

The slurry employed for the junction member is generally formed of ceramic powder, a binder, a plasticizer and a solvent. With these materials, the solvent must be capable of commonly dissolving the binders contained in the ceramic green sheets and the metal paste films. Also, the materials are preferably in such ratios that the slurry can be thinly applied as uniformly as possible. The solvent should be easily diffused and evaporated in a drying step, so that the ceramic green sheets can be joined with each other through dissolution of the binders. If such condition is satisfied, the junction member can be prepared only from a solvent.

Now we will describe a problem that is solved by a second embodiment of a method according to the invention, which embodiment will be described below with reference to FIGS. 8 and 9. In the step shown in FIG. 6, the junction member 47b which joins the ceramic green sheets 41a and 41b with each other and contains and covers the metal paste films 42 is applied over the entire surface of the ceramic green sheet 41a that has the metal paste films thereon. It has been confirmed by an experiment that, if such a junction member 47b is applied by screen printing, the parts that cover the metal paste films 42 are thicker, by about 50% of the physical thickness of the dried metal paste films 42, than the parts that cover the parts of the ceramic green sheet 41a provided with no metal paste films 42. Thus, when the ceramic green sheets are reduced in thickness or the number of stacked layers is increased, the outer surface of a finished product may be bulged or stress caused by contraction in drying and firing may remain around the edges of the metal paste films 42 or the internal electrodes, to detrimentally affect on the quality of the product. A method shown in FIGS. 8 and 9 is employed in order to avoid such inconvenience.

Figure 8:
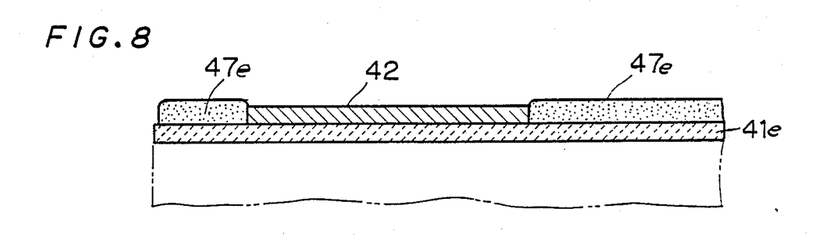
FIGS. 8 and 9 are enlarged sectional views illustrating another embodiment of the present invention.
Figure 9:
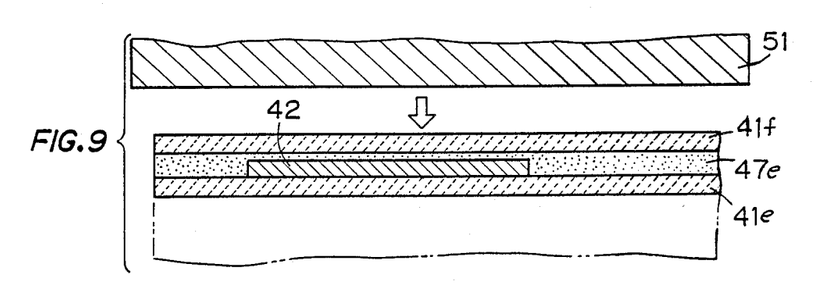

Referring to FIG. 8, a junction member 47e is applied on part of a first ceramic green sheet 41e. More specifically, the junction member 47e is applied on a region except for that provided with a metal paste film 42. Then, a second ceramic green sheet 41f is stacked over both the junction member 47e an the metal paste film 42. A pressurizing member 51 applies pressure on the second ceramic green sheet 41f as shown in FIG. 9, so that a part of the junction member 47e enters an interface between the metal paste film 42 and the second ceramic green sheet 41f. Thus, any difference in thickness caused by the metal paste film 42 can be effectively absorbed by the junction member 47e formed in this manner.

Figure 10:
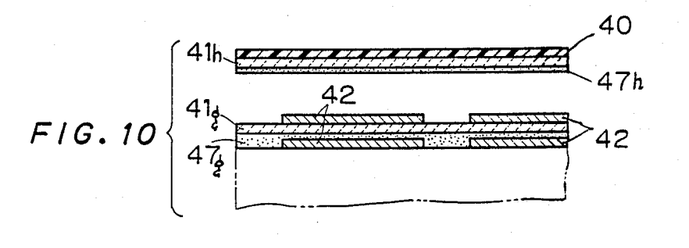
FIG. 10 is an enlarged sectional view for illustrating still another embodiment of the present invention.

FIG. 10 shows still another embodiment of the present invention, in which a junction member 47h is applied to a second ceramic green sheet 41h, which is thereby stacked on and joined to a first ceramic green sheet 41g which is joined to a junction member 47g and has one or more second metal paste films 42 thereon.

Junction members may alternatively be applied to both of a pair of ceramic green sheets to be joined with each other.

While the present invention has been described with reference to the drawings mainly in the case of obtaining a laminated ceramic capacitor, the present invention is widely applicable to various components comprising ceramic laminates, such as a laminated LC composite part, a ceramic multilayer substrate and the like.

Although the present invention has been described and illustrated in detail in connection with embodiments thereof, it is clearly understood that the same is by way of illustration and example only and is not to be taken by way of limitation, the scope of the present invention being limited only by the terms of the appended claims.

What is claimed is:

1. A method of manufacturing a ceramic laminate comprising the following steps:
   preparing a plurality of ceramic green sheets containing a first ceramic powder and a first binder;
   preparing a metal paste, containing a metal powder and a second binder;
   preparing a junction member containing a solvent which can commonly dissolve said first binder and said second binder;

preparing a base for receiving said plurality of ceramic green sheets thereon;

stacking said plurality of ceramic green sheets on said base and applying said junction member to the interface between each adjacent pair of said plurality of ceramic green sheets; and forming a film of said metal paste in the interface between at least one adjacent pair of said plurality of ceramic green sheets.

2. A method in accordance with claim 1, wherein said step of stacking said plurality of ceramic green sheets comprises the step of placing a second one of each adjacent pair of said ceramic green sheets on a first one thereof.

3. A method in accordance with claim 2, wherein one said junction member is applied on a surface of said first ceramic green sheet facing said second ceramic green sheet before said stacking step.

4. A method in accordance with claim 2, wherein one said junction member is applied on a surface of said second ceramic green sheet facing said first ceramic green sheet before said stacking step.

5. A method in accordance with claim 2, wherein respective said junction members are applied on respective surfaces on both said first and second ceramic green sheets facing each other before said stacking step.

6. A method in accordance with claim 2, wherein said second ceramic green sheet is held by carrier means and placed on said first ceramic green sheet while being held by said carrier means, said method further comprising the step of separating said carrier means from said second ceramic green sheet.

7. A method in accordance with claim 1, wherein said junction member comprises ceramic slurry containing a second ceramic powder and a third binder in addition to said solvent.

8. A method in accordance with claim 7, wherein said first ceramic powder and said second ceramic powder are identical in composition to each other, and said first binder and said third binder are identical in composition to each other.

9. A method in accordance with claim 7, wherein said first ceramic powder and said second ceramic powder are identical in composition to each other, and said first binder and said third binder are different in composition from each other.

10. A method in accordance with claim 7, wherein said first ceramic powder and said second ceramic powder are different in composition from each other, and said first binder and said third binder are identical in composition to each other.

11. A method in accordance with claim 7, wherein said first ceramic powder and said second ceramic powder are different in composition from each other and said first binder and said third binder are different in composition from each other.

12. A method in accordance with claim 1, wherein said plurality of ceramic green sheets include at least two types of ceramic green sheets, at least one of which contains materials of different composition from said first ceramic powder.

13. A method in accordance with claim 1, wherein said junction member is applied to a region of one of said ceramic green sheets containing said interface but not substantially applied to a region of said ceramic green sheet containing said interface in which said metal paste film is provided, in said step of applying said junction member.

14. A method in accordance with claim 1, wherein said metal paste film is formed on a prescribed one of said ceramic green sheets by printing, after positioning said green sheet by means of said base.

15. A method of manufacturing a ceramic laminate for a laminated ceramic capacitor comprising the following steps:

preparing a plurality of ceramic green sheets containing a first ceramic powder and a first binder;

preparing a metal paste, containing a metal powder and a second binder, for providing an internal electrode of said capacitor, and forming at least two films of said metal paste in the respective interfaces between at least two respective pairs of said plurality of ceramic green sheets;

preparing a junction member containing a solvent capable of commonly dissolving said first binder and said second binder;

preparing a base for receiving said plurality of ceramic green sheets thereon;

stacking said plurality of ceramic green sheets with one of said junction members being applied to the interface between each adjacent pair of said plurality of ceramic green sheets;

said metal paste films being formed in said interfaces by printing, after positioning said ceramic green sheets via said base.

16. A method in accordance with claim 14, further comprising a step of drying said metal paste film after formation of said metal paste film, in advance of stacking a subsequent said ceramic green sheet thereon.

17. A method in accordance with claim 2, wherein said second ceramic green sheet is held by carrier means, then separated from said carrier means, and then placed on said first ceramic green sheet.

18. A method in accordance with claim 1, wherein said base comprises a rigid plate made of a material with a low coefficient of thermal expansion.

19. A method in accordance with claim 18, wherein said material is selected from the group consisting of super invar, glass, and a ceramic.

20. A method in accordance with claim 18, further comprising an elastic layer formed on the rigid plate.

21. A method in accordance with claim 20, wherein said elastic layer is made of silicone rubber.

22. A method in accordance with claim 20, wherein said elastic layer has a thickness of about 1-5 mm and a hardness of about 40-80.

23. A method in accordance with claim 18, wherein said base further comprises a resin film.

24. A method in accordance with claim 23, wherein said resin film is made of polyethylene terephthalate.

25. A method in accordance with claim 1, wherein said ceramic green sheets contain barium titanate ceramic powder as said first ceramic powder and about 13 percent by weight of an acrylic binder as said first binder.

26. A method in accordance with claim 25, wherein said ceramic green sheets are formed from a ceramic slurry containing a delay solvent.

27. A method in accordance with claim 26, wherein said delay solvent is BCA (butyl carbitol acetate).

28. A method in accordance with claim 1, wherein said first ceramic powder is an alumina ceramic material.

29. A method in accordance with claim 1, wherein said first binder is selected from the group consisting of cellulose and vinyl binders.

30. A method in accordance with claim 16, wherein said junction member is formed on said metal paste film and dried simultaneously therewith.

31. A method in accordance with claim 31, wherein a further ceramic green sheet and metal paste film are formed thereafter.

32. A method in accordance with claim 16, wherein said junction member is formed on said metal paste film after said metal paste film has been dried.

33. A method in accordance with claim 32, wherein a further ceramic green sheet and metal paste film are formed thereafter.

34. A method in accordance with claim 9, wherein one of said first and third binders is an aqueous binder and the other of said first and third binders is an organic binder.

35. A method in accordance with claim 12, wherein one of said ceramic powders is selected to form dielectric sheets and the other of said ceramic powders is selected to form magnetic sheets.

* * * * *